(12) United States Patent
Togashi

(10) Patent No.: US 6,781,816 B2
(45) Date of Patent: Aug. 24, 2004

(54) ELECTRONIC COMPONENT

(75) Inventor: Masaaki Togashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/373,030

(22) Filed: Feb. 26, 2003

(65) Prior Publication Data

US 2003/0161089 A1 Aug. 28, 2003

(30) Foreign Application Priority Data

Feb. 28, 2002 (JP) .................................. 2002-052808

(51) Int. Cl.$^7$ ............................................ H01G 4/228
(52) U.S. Cl. ........................... 361/306.3; 361/301.1; 361/301.4; 361/321.3; 361/305; 361/311; 361/313
(58) Field of Search ........................... 361/306.1, 306.3, 361/301.4, 301.1, 303, 305, 309, 311, 313, 320, 321.1, 321.5

(56) References Cited

U.S. PATENT DOCUMENTS

| | | | | |
|---|---|---|---|---|
| 5,311,651 A | * | 5/1994 | Kim et al. ............... | 29/25.42 |
| 6,191,933 B1 | * | 2/2001 | Ishigaki et al. .......... | 361/309 |
| 6,331,930 B1 | * | 12/2001 | Kuroda et al. ........... | 361/306.3 |
| 6,380,619 B2 | * | 4/2002 | Ahiko et al. ............. | 257/703 |

FOREIGN PATENT DOCUMENTS

| | | |
|---|---|---|
| JP | 2000-173860 | 6/2000 |
| JP | 2001-185446 | 7/2001 |
| JP | 2001-189232 | 7/2001 |

* cited by examiner

Primary Examiner—Dean A. Reichard
Assistant Examiner—Nguyen T. Ha
(74) Attorney, Agent, or Firm—Oblon, Spivak, McClelland, Maier & Neustadt, P.C.

(57) ABSTRACT

An electronic component includes: a dielectric element formed by layering dielectric layers; two types of internal conductors, which have a plurality of extended portions, respectively, that are extended toward a plurality of side surfaces of the dielectric element, respectively; two types of terminal electrodes, of which one of the two types of terminal electrodes is connected to a plurality of extended portions of one of the two types of internal conductors, and the other of the two types of terminal electrodes is connected to the remaining plurality of extended portions; and a pair of metallic terminals, of which one of the metallic terminals is connected to one of the two types of terminal electrodes, and the other of the metallic terminals is connected to the remaining terminal electrodes. Accordingly, ESR can be reduced while allowing for sufficient absorption of stress.

17 Claims, 15 Drawing Sheets

ELECTRONIC COMPONENT

BACKGROUND OF THE INVENTION

1. Field of the Invention

The present invention relates to an electronic component that reduces equivalent series resistance (ESR) while allowing for sufficient absorption of thermal stress and mechanical stress, and is optimum for multilayer capacitors used in a switching power supply.

2. Description of the Related Art

In recent years, due to advances in compactness and improvements in large current flow of the switching power supply, the necessity for diffusing and radiating heat that generates from components mounted upon this switching power supply has arisen. Consequently, an aluminum wiring board with great heat radiating capability is generally employed for this switching power supply. However, the thermal expansion coefficient for this aluminum wiring board is large.

Accordingly, due to directly mounting upon an aluminum wiring board a ceramic component with a thermal expansion coefficient greatly differing from that of this aluminum wiring board, cracks may develop in this component due to large thermal stress generating in this component, or the aluminum wiring board may greatly transform due to thermal expansion of the aluminum wiring board itself, whereby developing cracks in this component due to mechanical stress. As a result, there were fears that reliability of the switching power supply would be lost.

Meanwhile, a ceramic capacitor element with a long life span and excellent frequency characteristics is generally utilized as a smoothing capacitor for smoothing switching power supply output. Due to the above problems, however, in the case of mounting this capacitor element upon an aluminum wiring board, one that has a pair of metallic terminals connected to this capacitor element is generally used.

Specifically, a conventional compound ceramic capacitor 100 is illustrated in FIG. 14 and FIG. 15, whereby the compound ceramic capacitor 100 is described below based on these drawings.

The interior of this compound ceramic capacitor 100 has a structure where two types of T-shaped internal conductors 104 and 105 illustrated in FIG. 14 overlap via ceramic layers 103A. A multilayer body 103 illustrated in FIG. 15 is then formed by layering a plurality of these ceramic layers 103A, and these internal conductors 104 are extended toward one of the four side surfaces of this multilayer body 103. Furthermore, the internal conductors 105 are extended toward the side surface of the multilayer body 103 opposite to the side surface whereat the internal conductors 104 are extended.

Moreover, as shown in FIG. 15, terminal electrodes 106, which are to be connected to the internal conductors 104, and terminal electrodes 107, which are to be connected to the internal conductors 105, are respectively placed at mutually opposing side surfaces of multilayer capacitor elements 101. As illustrated in FIG. 15, a pair of metallic terminals 111, 112 that are respectively formed in an L-shape are then attached by solder or conductive adhesive in a form sandwiching two multilayer capacitor elements 101, for example. Thus, this pair of metallic terminals 111, 112 plays the role of absorbing and alleviating through elastic deformation the stress that generates due to thermal expansion and the like of the aluminum wiring board, and reducing the stress that generates in the ceramic multilayer capacitor elements 101.

At the same time, accompanying improvements in large current flow for the switching power supply, a large ripple current comes to flow within the smoothing capacitor. Since this ripple current is consumed in the form of heat generation due to the equivalent series resistance (ESR) of the capacitor, which then self-heats according to charging and discharging, detrimental effects to the life of the capacitor occur.

Accordingly, recent increase in ripple currents have come to threaten the reliability of the multilayer capacitor elements 101 regardless of using the aluminum wiring board with great heat radiating capability. The above compound ceramic capacitor 100 is then greatly influenced by the electric resistance of the metallic terminals 111 and 112, having defects that incur an increase in ESR.

Thus, even with a multilayer capacitor having a pair of metallic terminals as is used for the aluminum wiring board, reduction in ESR has come to be desired.

SUMMARY OF THE INVENTION

The present invention aims to provide an electronic component that reduces ESR while allowing for sufficient absorption of thermal stress and mechanical stress.

According to a first aspect of the present invention, an electronic component, comprising a dielectric element formed by layering dielectric layers; two types of internal conductors, which are respectively arranged within the dielectric element while separated from each other by the dielectric layers, and have a plurality of extended portions, respectively, that are extended toward a plurality of side surfaces of the dielectric element, respectively; two types of terminal electrodes, which are arranged at a plurality of side surfaces of the dielectric element, respectively; one of the two types of terminal electrodes connected to a plurality of extended portions of one of the two types of internal conductors, and the other of the two types of terminal electrodes connected to the remaining plurality of extended portions; and a pair of metallic terminals, which are respectively formed by metallic material; one of the metallic terminals connected to one of the two types of terminal electrodes, and the other of the metallic terminals connected to the remaining terminal electrodes, is provided.

According to such electronic component, operations as in the following take effect.

The electronic component according to this aspect has a structure with two types of internal conductors respectively arranged within a dielectric element, which is formed by layering dielectric layers, while separated from each other by the dielectric layers, and a plurality of extended portions, respectively, that are extended toward a plurality of side surfaces of the dielectric element, respectively, are provided to these two types of internal conductors, respectively.

Furthermore, two types of terminal electrodes are arranged at a plurality of sides surfaces of the dielectric element, respectively. One of these two types of terminal electrodes is connected to a plurality of extended portions of one of the two types of the internal conductors, and the other of these two types of terminal electrodes is connected to the remaining plurality of extended portions.

Moreover, a pair of metallic terminals are respectively formed by metallic material, of which one of the pair of metallic terminals is connected to one of the two types of terminal electrodes, and the other of the metallic terminals is connected to the remaining terminal electrodes.

Thus, according to this aspect, the elastic deformation of the metallic terminals assures absorption of the flexure and thermal expansion of the aluminum wiring board, thereby reducing thermal stress and mechanical stress that generate in the multilayer capacitor elements and stopping cracks from generating in the multilayer capacitor elements.

Furthermore, in this aspect as described above, the plurality of extended portions that are extended toward the plurality of side surfaces of the dielectric element, respectively, are provided to the two types of internal conductors, respectively, and the two types of terminal electrodes are arranged at a plurality of side surfaces of the dielectric element, respectively. Moreover, since it has a structure with these two types of internal conductors and two types of terminal electrodes connected to each other, the area of the portions connecting the internal conductors and terminal electrodes increases. Accordingly, the area of the portions connecting the terminal electrodes and metallic terminals then also increases, ultimately reducing ESR as a result.

Thus, since the area of these connecting portions increases and ESR reduces, according to this aspect, an electronic component that decreases ESR while allowing for sufficient absorption of stress can be obtained.

Furthermore, due to the increased area of each connecting portion, radiation to the aluminum wiring board is improved and self-heating is reduced, leading to improvements in reliability of the multilayer capacitor elements. On one hand, by decreasing ESR, elimination of high ripple currents can be achieved, as well as self-heating of the capacitor that generates due to charging and discharging is reduced, whereby increasing the life of electronic components such as capacitors is possible.

On the other hand, respectively forming a pair of metallic terminals in a form having a plurality of connecting surfaces whereto the terminal electrodes are connected, respectively, may be considered as a modified example of the electronic component according to this aspect. Thus, according to this modified example, since the pair of metallic terminals have a form that has a plurality of connecting surfaces, respectively, which are respectively connected to the terminal electrodes, the area of the portions connecting the terminal electrodes and metallic terminals can be increased by effectively utilizing the side surfaces of the dielectric element, and the operational effects of this aspect may be even more reliably provided.

Furthermore, each metallic terminal obtaining a plurality of connecting surfaces by folding a board material may be considered as a modified example of the electronic component according to this aspect. Thus, according to this modified example, merely by folding the board material, a plurality of connecting surfaces may be easily formed, allowing for the terminal electrodes to be connected at these plurality of connecting surfaces. Consequently, the area of the portions connecting the terminal electrodes and metallic terminals increases, and the operational effects of this aspect may be even more reliably provided even according to this modified example.

At the same time, one end portion of each metallic terminal is a connecting side that is connected to a terminal electrode, as well as the other end is an outer connecting portion that is connected to the outside may be considered as a modified example of the electronic component according to this aspect. Thus, according to this modified example, since the outer connecting portions are connected to, for example, land patterns of an external aluminum wiring board, the terminal electrodes and outer elements can be reliably connected via the metallic terminals. Thus, the operational effects of this aspect may be even more reliably provided even according to this modified example.

Furthermore, associated herewith, forming a plurality of outer connecting portions in the metallic terminals may be considered as a modified example. In other words, according to this modified example, since the outer connecting portions that are connected to the outside are formed in plurality, the area of the portions connecting the metallic terminals and the outside increases, whereby the operational effects of this aspect may be even more reliably provided even according to this modified example.

According to another aspect of the present invention, an electronic component, comprising a dielectric element formed by layering dielectric layers; two types of internal conductors, which are respectively arranged within the dielectric element while separated from each other by the dielectric layers, and have a single extended portion that is extended in a form continuing across a plurality of side surfaces of the dielectric element, respectively; two types of terminal electrodes, each of which is arranged in a form continuing across a plurality of side surfaces of the dielectric element; one of the two types of terminal electrodes connected to an extended portion of one of the two types of internal conductors, and the other of the two types of terminal electrodes connected to the remaining extended portion; and a pair of metallic terminals, which are respectively formed by metallic material; one of the metallic terminals connected to one of the two types of terminal electrodes, and the other of the metallic terminals connected to the remaining terminal electrode, is provided.

According to such electronic component, operations as in the following take effect.

The electronic component according to this aspect has the same structure as with the above first aspect of the present invention. However, instead of respectively having the plurality of extended portions that are extended toward a plurality of side surfaces of the dielectric element, respectively, the two types of internal conductors respectively have a single extended portion that is extended in a form continuing across a plurality of side surfaces of the dielectric element. Accordingly, two types of terminal electrodes, which are respectively connected to the extended portions, are arranged in a form continuing across a plurality of side surfaces of the dielectric element, respectively.

Accordingly, since not only are the extended portions formed in a form continuing across a plurality of side surfaces of the dielectric element, but the terminal electrodes are also formed in a form continuing across a plurality of side surfaces of the dielectric element, the number of terminal electrodes can effectively be reduced without reducing the area of connecting portions. Not only do the same operations as with the above first aspect of the present invention take effect as a result, but manufacturing costs of electronic components are lowered.

Meanwhile, besides considering the same structure as with the aforementioned first aspect, forming the extended portion having a length of at least ⅓ the length of the side surface of the dielectric element whereto the extended portion of each internal conductor is extended may be considered as a modified example of the electronic component according to this aspect. Thus, according to this modified example where extended portions are formed to be longer than conventional ones, effective utilization of the dielectric element side surfaces is possible, and the operational effects of the above first aspect of the present invention may be even more reliably provided.

According to yet another aspect of the present invention, an electronic component, comprising a dielectric element formed by layering dielectric layers; two types of internal conductors, which are respectively arranged within the dielectric element while separated from each other by the dielectric layers, and have a single extended portion, respectively, which is extended in a form continuing across three side surfaces of the dielectric element; two types of terminal electrodes, each of which is arranged in a form continuing across three side surfaces of the dielectric element; one of the two types of terminal electrodes connected to the extended portion of one of the two types of internal conductors, and the other of the two types of terminal electrodes connected to the remaining extended portion; and a pair of metallic terminals, which are respectively formed by metallic material, one of the metallic terminals connected to one of the two types of terminal electrodes, and the other of the metallic terminals connected to the remaining terminal electrode, is provided.

According to such electronic component, operations as in the following take effect.

The electronic component according to this aspect has the same structure as with the above first aspect of the present invention. However, instead of respectively having the plurality of extended portions that are extended toward a plurality of side surfaces of the dielectric element, respectively, the two types of internal conductors respectively have a single extended portion that is extended in a form continuing across three side surfaces of the dielectric element. Accordingly, two types of terminal electrodes, which are connected to the extended portions, respectively, are arranged in a form continuing across three side surfaces of the dielectric element, respectively.

Accordingly, not only do the same operations as with the above first aspect of the present invention take effect according to this aspect, but the extended portions are formed in a form continuing across three side surfaces of the dielectric element, as well as the terminal electrodes are arranged in a form continuing across three side surfaces of the dielectric element. Thus, the number of terminal electrodes can effectively be reduced without reducing the area of connecting portions, whereby manufacturing costs of electronic components are lowered as a result.

Meanwhile, the same structure as with the aforementioned first aspect of the present invention may be considered as a modified example of the electronic component according to this aspect.

According to yet another aspect of the present invention, an electronic component, comprising a dielectric element formed by layering dielectric layers; two types of internal conductors, which are respectively arranged within the dielectric element while separated from each other by the dielectric layers; one of the two types of internal conductors having a single extended portion that is extended in a form continuing across a plurality of side surfaces of the dielectric element, and the other of the two types of internal conductors having a single extended portion that is extended toward one side surface of the dielectric element; two types of terminal electrodes, at least one of the two types of terminal electrodes arranged in a form continuing across a plurality of side surfaces of the dielectric element; one of the two types of terminal electrodes connected to the extended portion of one of the two types of internal conductors, and the other of the two types of terminal electrodes connected to the remaining extended portion; and a pair of metallic terminals, which are respectively formed by metallic material; one of the metallic terminals connected to one of the two types of terminal electrodes, and the other of the metallic terminals connected to the remaining terminal electrode, is provided.

According to such electronic component, operations as in the following take effect.

The electronic component according to this aspect has the same structure as with the above first aspect of the present invention. However, instead of the two types of internal conductors that respectively have the plurality of extended portions, which are extended toward a plurality of side surfaces of the dielectric element, respectively, one of the two types of internal conductors have a single extended portion that is extended in a form continuing across a plurality of side surfaces of the dielectric element, and the other of the two types of internal conductors have a single extended portion that is extended toward one side surface of the dielectric element. Accordingly, at least one of the two types of terminal electrodes, which are respectively connected to the extended portion, is arranged in a form continuing across a plurality of side surfaces of the dielectric element.

Accordingly, not only do the same operations as with the above first aspect of the present invention take effect according to this aspect, but one of the two types of internal conductors has an extended portion that is formed in a form continuing across a plurality of side surfaces of the dielectric element, and at least one of the terminal electrodes is arranged in a form continuing across a plurality of side surfaces of the dielectric element. Thus, the number of terminal electrodes can effectively be reduced without reducing the area of connecting portions, whereby manufacturing costs of electronic components are lowered as a result.

Meanwhile, besides considering the same structure as with the aforementioned first aspect, connecting the terminal electrodes, which are formed continuously across a plurality of side surfaces of the dielectric element, to a single extended portion that is extended in a form continuing across a plurality of side surfaces of the dielectric element may be considered as a modified example of the electronic component according to this aspect. In other words, by connecting the above terminal electrodes across the entire individual extended portion, which is extended in a form continuing across a plurality of side surfaces, the operational effects of this aspect may be even more reliably provided.

DETAILED DESCRIPTION OF THE PREFERRED EMBODIMENTS

Figure 1:
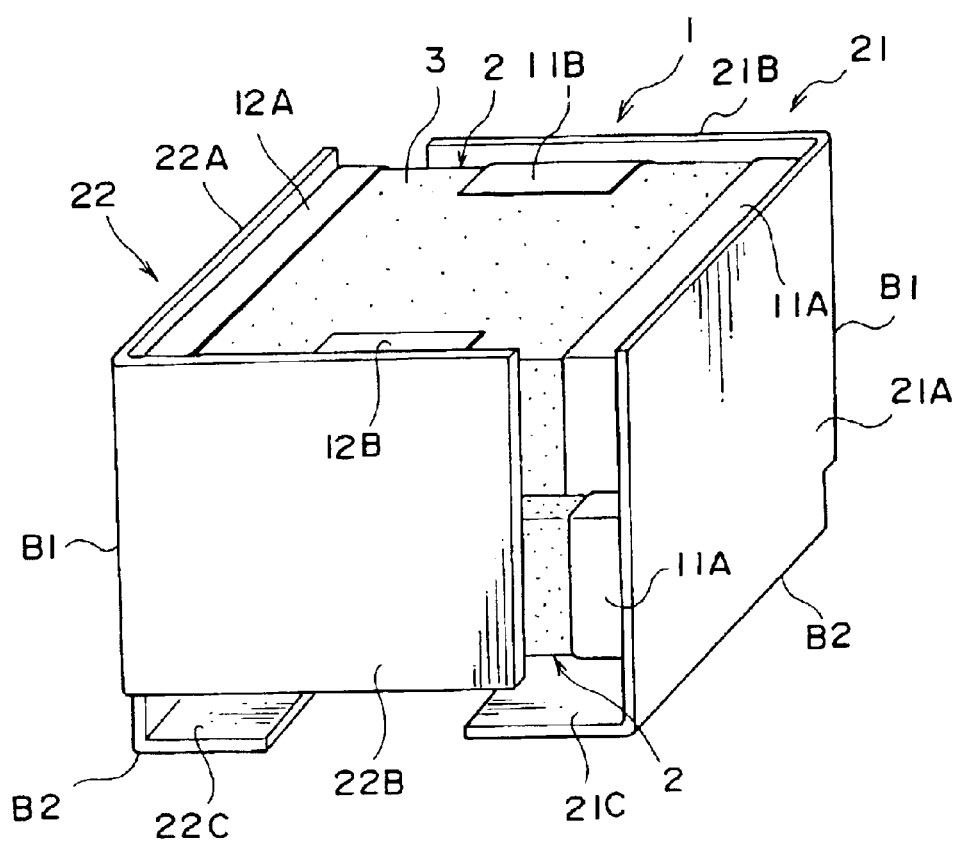
FIG. 1 is a perspective view illustrating a compound ceramic capacitor according to a first embodiment of the present invention.

Hereinafter, embodiments of an electronic component according to the present invention is described based upon the diagrams.

A compound ceramic capacitor 1, which is an electronic component according to the first embodiment of the present invention, is illustrated in FIG. 1 through FIG. 5. Furthermore, each multilayer capacitor element 2 is configured with a dielectric element 3, which is a rectangular parallelepiped sintered body obtained through baking a multilayer body of a plurality of layered ceramic green sheets, as its principle part. In addition, this multilayer capacitor element 2 is regarded as a device of the compound ceramic capacitor In other words, the dielectric element 3 is formed by layering dielectric layers, which are baked ceramic green sheets. Moreover, as the internal structure shown in FIG. 2 and FIG. 3, planar internal conductors 4 are respectively arranged at predetermined levels within this dielectric element 3, and similarly, planar internal conductors 5 are respectively arranged below each of the internal conductors 4, which partition ceramic layers 3A that are dielectric layers in the dielectric element 3. Continuing in the same manner, a plurality of layers (for example, approximately 100 layers) of the internal conductors 4 and internal conductors 5, which are respectively formed in the same manner, are repeatedly arranged partitioning ceramic layers 3A, respectively.

Figure 2:
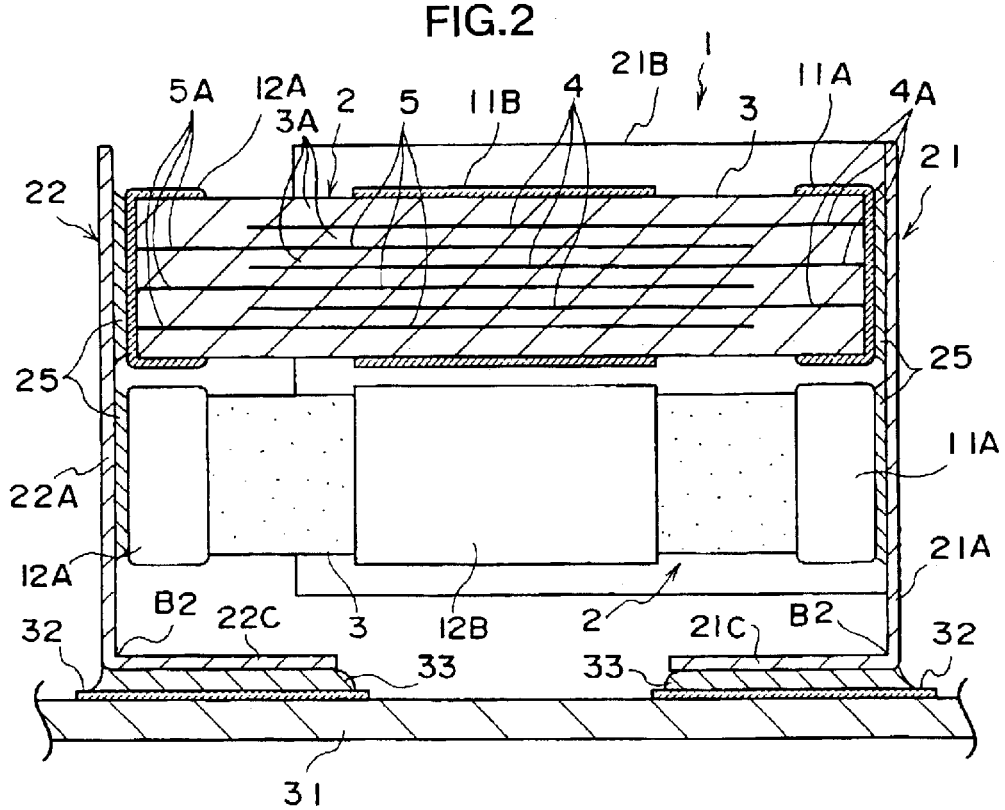
FIG. 2 is a front view illustrating the compound ceramic capacitor according to the first embodiment of the present invention, and is a diagram showing a fragmented portion.

Consequently, as illustrated in FIG. 2, the two types of internal conductors made from these internal conductors 4 and internal conductors 5 are arranged facing each other in the dielectric element 3 while being separated by ceramic layers 3A. The center of these internal conductors 4 and internal conductors 5 are arranged at nearly the same level as the center of each of the ceramic layers 3A; furthermore, length and width measurements of the internal conductors 4 and internal conductors 5 are respectively made to be smaller than the length of the corresponding ceramic layer 3A side.

Figure 3:
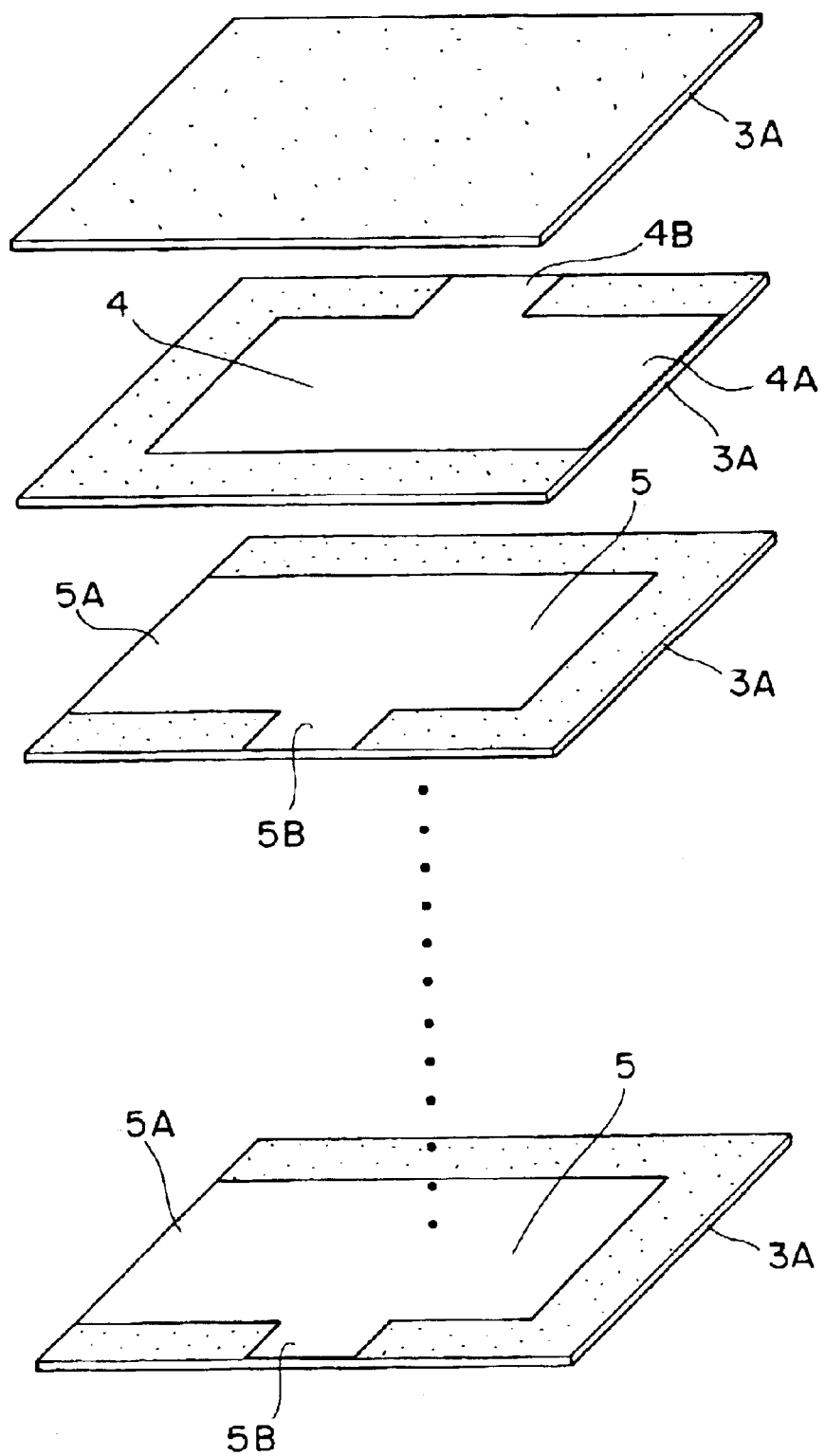
FIG. 3 is an exploded perspective view of a multilayer capacitor element that applies to the first embodiment of the present invention.

However, as illustrated in FIG. 3, by extending conductors with the same width measurement as that of the internal conductors 4 from the right side portion of the internal conductors 4 towards the right side end portion of each ceramic layer 3A, an extended portion 4A is formed in each of the respective internal conductors 4. Apart from this, an extended portion 4B is formed in each of the respective internal conductors 4 by extending conductors from the back side portion of the internal conductors 4 towards the back side end portion of each ceramic layer 3A.

Furthermore, by extending conductors with the same width measurement as that of the internal conductors 5 from the left side portion of the internal conductors 5 towards the left side end portion of each ceramic layer 3A, an extended portion 5A is formed in each of the respective internal conductors 5. Apart from this, an extended portion 5B is formed in each of the internal conductors 5 by extending conductors from the front side portion of the internal conductors 5 towards the front side end portion of each ceramic layer 3A.

Figure 4:
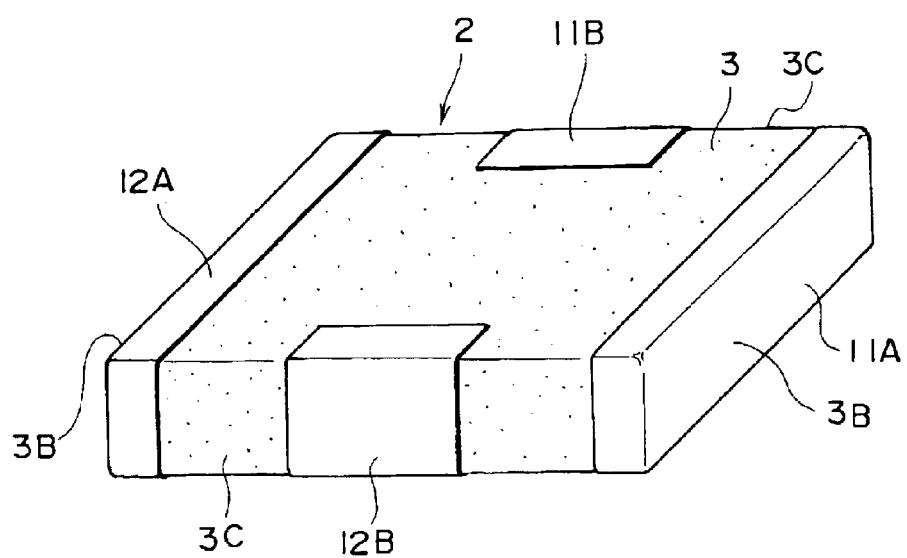
FIG. 4 is a perspective view illustrating the multilayer capacitor element that applies to the first embodiment of the present invention.
Figure 5:
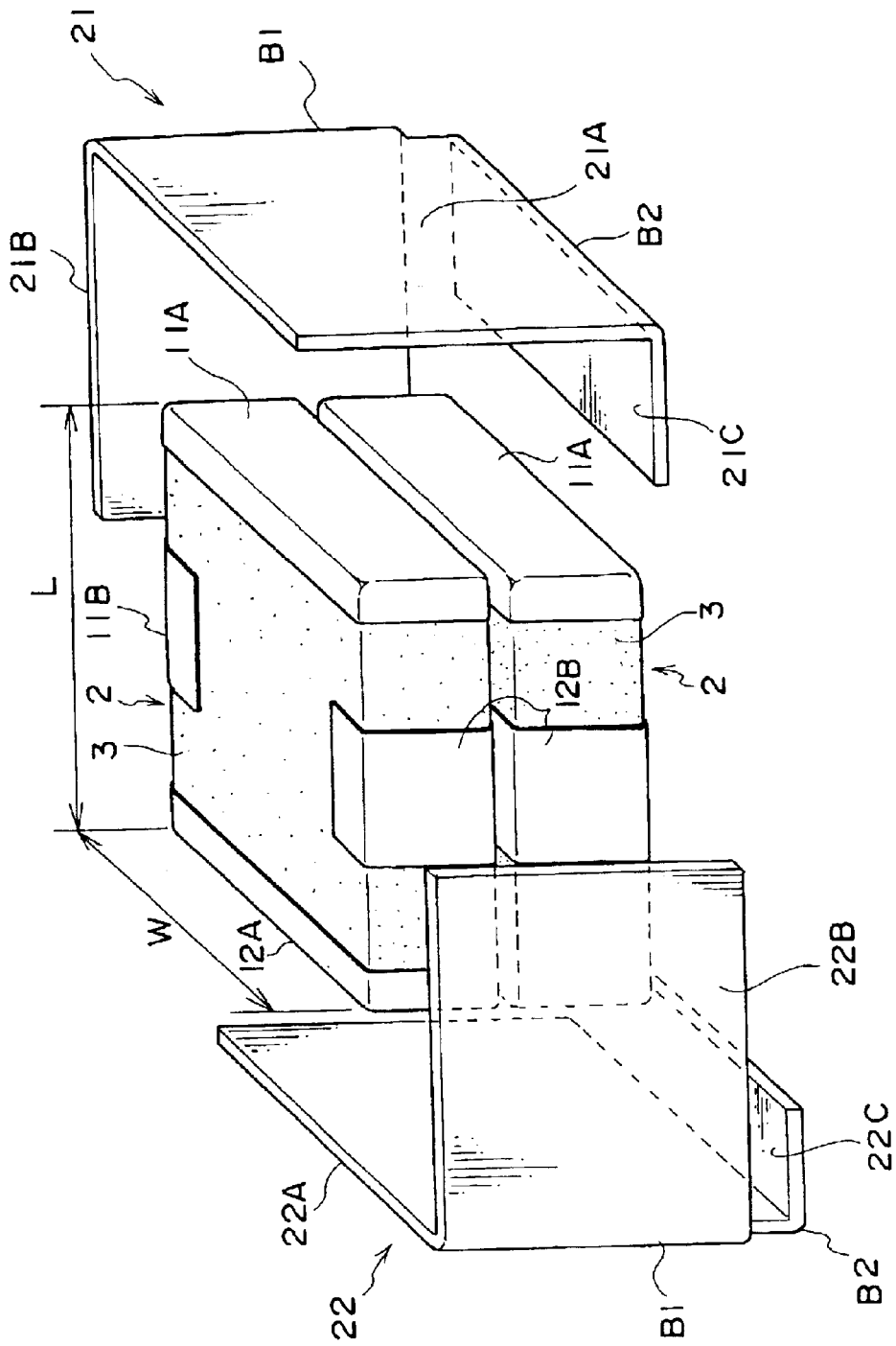
FIG. 5 is an exploded perspective view illustrating the compound ceramic capacitor according to the first embodiment of the present invention.

As illustrated in FIGS. 2, 4 and 5, each terminal electrode 11A, which is connected to the extended portions 4A at the right side of the internal conductors 4, is arranged at the right side surface 3B of each dielectric element 3 so as to be positioned at the outer side of the dielectric element 3. Furthermore, each terminal electrode 11B, which is connected to the extended portions 4B of the internal conductors 4, is arranged at the back side surface 3C of each dielectric element 3 so as to be positioned at the outer side of the dielectric element 3. Accordingly, these terminal electrodes 11A and 11B are respectively connected to the same internal conductors 4, and are thus the identical type of terminal electrode, which are mutually of the same polarity.

Meanwhile, each terminal electrode 12A, which is connected to the extended portions 5A at the left side of the internal conductors 5, is arranged at the left side surface 3B of each dielectric element 3 so as to be positioned at the outer side of the dielectric element 3. Furthermore, each terminal electrode 12B, which is connected to the extended portions 5B of the internal conductors 5, is arranged at the front side surface 3C of each dielectric element 3 so as to be positioned at the outer side of the dielectric element 3. Accordingly, these terminal electrodes 12A and 12B are respectively connected to the same internal conductors 5, and are thus the identical type of terminal electrode, which are mutually of the same polarity.

Thus, in this embodiment, the multilayer capacitor element 2 comprises two types of terminal electrodes in the form of two types of terminal electrodes, which are made from the terminal electrodes 11A and 11B and terminal electrodes 12A and 12B, respectively, arranged at the four side surfaces 3B and 3C of the rectangular parallelepiped dielectric element 3 of the multilayer capacitor element 2.

On one hand, as illustrated in FIG. 1 and FIG. 2, the compound ceramic capacitor 1 according to this embodiment has two multilayer capacitor elements 2 arranged one above the other, and a pair of metallic terminals 21 and 22, which are respectively formed by metallic material, are connected at both end portions of these two multilayer capacitor elements 2, respectively.

In other words, the metallic terminal 21 from the pair of metallic terminals 21 and 22 has inner connecting portions 21A and 21B, which are two connecting surfaces perpendicular to each other. Furthermore, the metallic terminal 22 has inner connecting portions 22A and 22B, which are two connecting surfaces perpendicular to each other.

Accordingly, in this embodiment, by folding the boards at a right angle at respective folding lines B1, the pair of metallic terminals 21 and 22 are formed in L-shaped structures having a plurality of or two connecting surfaces, respectively.

Moreover, the inner connecting portion 21A is connected to the right side terminal electrode 11A of each multilayer capacitor element 2, as well as the inner connecting portion 21B is connected to the back side terminal electrode 11B, whereby the metallic terminal 21, which is one of the metallic terminals, is connected to these terminal electrodes 11A and 11B. Furthermore, the inner connecting portion 22A is connected to the left side terminal electrode 12A of each multilayer capacitor element 2, as well as the inner connecting portion 22B is connected to the front side terminal electrode 12B, whereby the metallic terminal 22, which is the other of the metallic terminals, is connected to these terminal electrodes 12A and 12B.

In other words, the end portions of the pair of metallic terminals 21 and 22, which oppose the multilayer capacitor elements 2, are the inner connecting portions 21A and 21B and inner connecting portions 22A and 22B, respectively, which are the connecting surfaces connected to the surfaces of the terminal electrodes 11A and 11B and terminal electrodes 12A and 12B, respectively. It should be noted that bonding material 25 is used when connecting the inner connecting portions 21A, 21B, 22A, and, 22B to the respective terminal electrodes 11A, 11B, 12A, and, 12B, and conductive adhesive including resin or solder, for example, may be employed as this bonding material 25.

Moreover, outer connecting portions 21C and 22C are formed in a form bent towards the multilayer capacitor element 2 from the respective inner connecting portions 21A and 22A at the folding lines B2 of portions that are the other end portions of the pair of respective metallic terminals 21 and 22 and are beneath the inner connecting portions 21A and 22A.

These outer connecting portions 21C and 22C are connectable to the external members of this compound ceramic capacitor 1. It should be noted that in this embodiment, as illustrated in FIG. 2, each of the internal conductors 4 and 5 functions as the capacitor's electrodes, and these outer connecting portions 21C and 22C are connected with bonding material 33 such as solder to land patterns 32 on an aluminum wiring board 31, which is used for the switching power supply.

On the other hand, these metallic terminals 21 and 22 are produced by first punching out the metallic terminals 21 and 22 from metallic material, and then folding the metallic terminals 21 and 22 at the folding lines B1 and B2, respectively, so that the metallic terminals 21 and 22 with a structure as shown in FIG. 5 can be manufactured. Subsequently, this pair of metallic terminals 21 and 22 is then bonded to the periphery of the two multilayer capacitor elements 2 with the bonding material 25, whereby the compound ceramic capacitor 1 illustrated in FIG. 1 and FIG. 2 is completed.

Next, operations of the compound ceramic capacitor 1 according to this embodiment is described.

The multilayer capacitor elements 2 that configure the compound ceramic capacitor 1 according to this embodiment have a structure, as illustrated in FIG. 2 and FIG. 3, with two types of internal conductors 4 and 5 respectively arranged in each dielectric element 3, which is formed by layering the ceramic layers 3A, and separated from each other by the ceramic layers 3A. It is also a structure with the extended portions 4A and 4B and extended portions 5A and 5B, which are extended toward the two side surfaces 3B and 3C of each dielectric element 3, respectively, provided to these two types of internal conductors 4 and 5, respectively.

Furthermore, as illustrated in FIG. 4, the terminal electrodes 11A and 12B and terminal electrodes 12A and 12B, which are two types of terminal electrodes, are arranged across the two side surfaces 3B and 3C of the dielectric element 3, respectively. These terminal electrodes 11A and 11B are then connected to the extended portions 4A and 4B of the internal conductors 4, and these terminal electrodes 12A and 12B are connected to the extended portions 5A and 5B of the internal conductors 5.

Moreover, as illustrated in FIG. 1, the pair of metallic terminals 21 and 22 are respectively formed from metallic material in the form of having two connecting surfaces. The metallic terminal 21 is connected to the terminal electrodes 11A and 11B at the inner connecting portions 21A and 21B, respectively, which are its two connecting surfaces, and the metallic terminal 22 is connected to the terminal electrodes 12A and 12B at the inner connecting portions 22A and 22B, respectively, which are its two connecting surfaces.

Accordingly, the elastic deformation of these metallic terminals 21 and 22 assures absorption of the flexure and thermal expansion of the aluminum wiring board 31, thereby reducing thermal stress and mechanical stress that generate in the multilayer capacitor elements 2 and stopping cracks from generating in the multilayer capacitor elements 2.

Furthermore, as previously described, the extended portions 4A and 4B, which are extended toward the two side surfaces 3B and 3C of the dielectric element 3, respectively, are provided to the inner conductors 4, and the extended portions 5A and 5B, which are extended toward the two side surfaces 3B and 3C of the dielectric element 3, respectively, are provided to the inner conductors 5.

Moreover, the terminal electrodes 11A and 11B are arranged at the two side surfaces 3B and 3C of the dielectric element 3, respectively, and the terminal electrodes 12A and 12B are arranged at the two side surfaces 3B and 3C of the dielectric element 3, respectively. It then becomes a structure with these two types of inner conductors 4 and 5 connected to the two types of terminal electrodes 11A and 11B, and terminal electrodes 12A and 12B, respectively.

Therefore, the area of the portions that connect the internal conductors 4 to the terminal electrodes 11A and 11B, and the area of those that connect the internal conductors 5 to the terminal electrodes 12A and 12B increase. Accordingly, the area of the portions that connect the metallic terminal 21 to the terminal electrodes 11A and 11B, and the area of those that connect the metallic terminal 22 to the terminal electrodes 12 and 12B also increase, whereby ESR decreases as a result.

Thus, since the area of these connecting portions increases and ESR decreases, according to this embodiment, the compound ceramic capacitor 1 with decreased ESR may be obtained while allowing for sufficient absorption of stress.

Furthermore, due to the increased area of each connecting portion, radiation to the aluminum wiring board 31 is improved and self-heating is reduced, leading to improvements in reliability of the multilayer capacitor elements 2. On one hand, by decreasing ESR, elimination of high ripple currents can be achieved, as well as self-heating of the capacitor that generates due to charging and discharging is reduced, whereby increasing the life of the compound ceramic capacitor 1 is possible.

On the other hand, according to this embodiment, a plurality of connecting surfaces may be easily formed in the metallic terminals 21 and 22 just by merely folding the board material. In other words, connecting the terminal electrodes 11A, 11B, 12A, and 12B to the metallic terminals 21 and 22 is possible via these plurality of connecting surfaces, which are formed through simple processing of folding the board material. As a result, easily increasing the area of the portions that connect the terminal electrodes 11A, 11B, 12A, and 12B to the metallic terminals 21 and 22 as described above has become possible.

Figure 6:
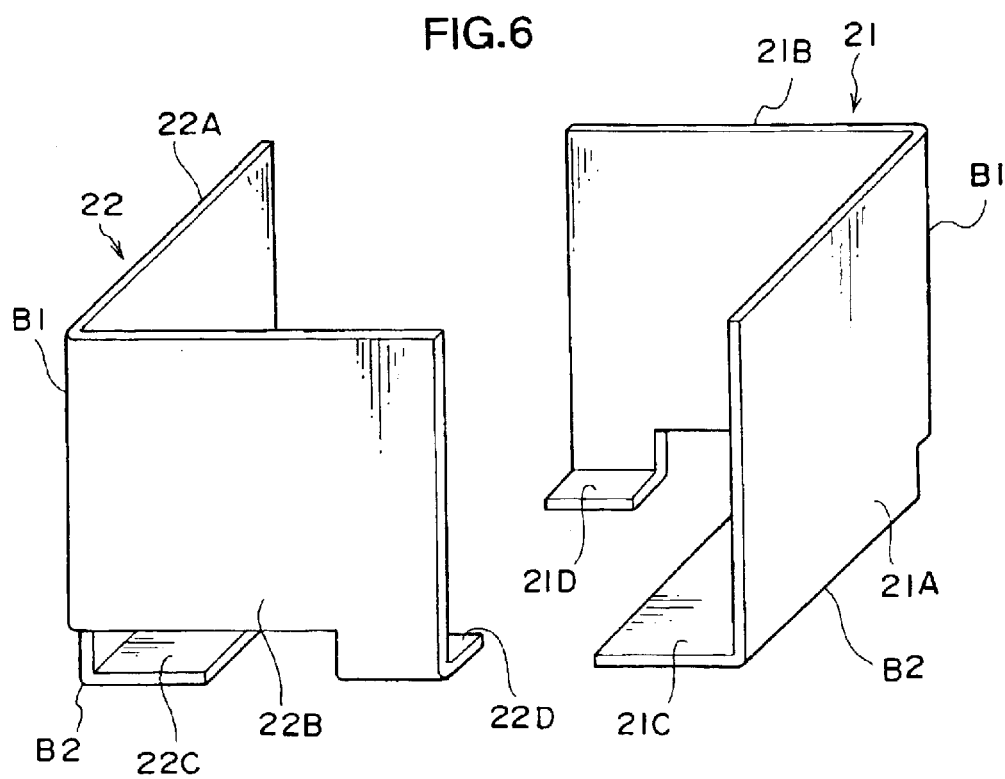
FIG. 6 is a perspective view illustrating a pair of metallic terminals that applies to a second embodiment of the present invention.

Next, an electronic component according to the second embodiment of the present invention is described based upon FIG. 6. It should be noted that the same reference numerals are applied to the same parts as described in the first embodiment, respectively, and duplicate descriptions will be omitted.

This embodiment as illustrated in FIG. 6 has approximately the same structure as in the first embodiment. However, an outer connecting portion 21D whereto the land pattern 32 can be connected is also formed beneath the inner connecting portion 21B of the metallic terminal 21 in a bent form from the inner connecting portion 21B. Furthermore, an outer connecting portion 22D whereto the land pattern 32 can be connected is also formed beneath the inner connecting portion 22B of the metallic terminal 22 in a bent form from the inner connecting portion 22B.

In other words, in this embodiment, a plurality of the outer connecting portions 21C and 21D are formed in the metallic terminal 21, and a plurality of the outer connecting portions 22C and 22D are formed in the metallic terminal 22. According to this embodiment, outer connecting portions, which are connected to the land patterns 32 of the external aluminum wiring board 31, are thus formed in plurality. As a result, operational effects whereby the area of the portions that connect the metallic terminals 21 and 22 to the outside increases and ESR decreases while allowing for sufficient absorption of stress may be more reliably provided.

Figure 7:
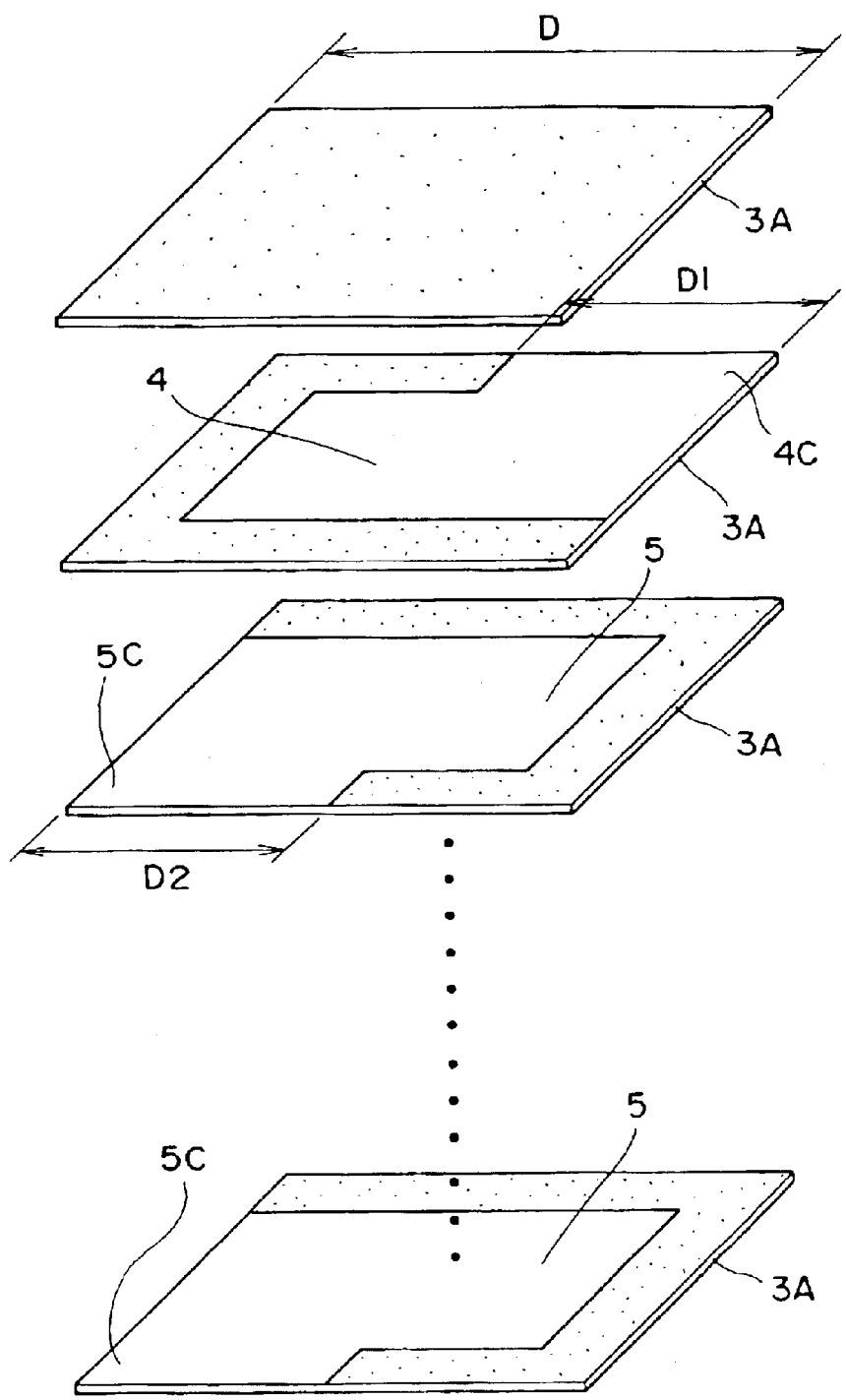
FIG. 7 is an exploded perspective view of a multilayer capacitor element that applies to a third embodiment of the present invention.
Figure 8:
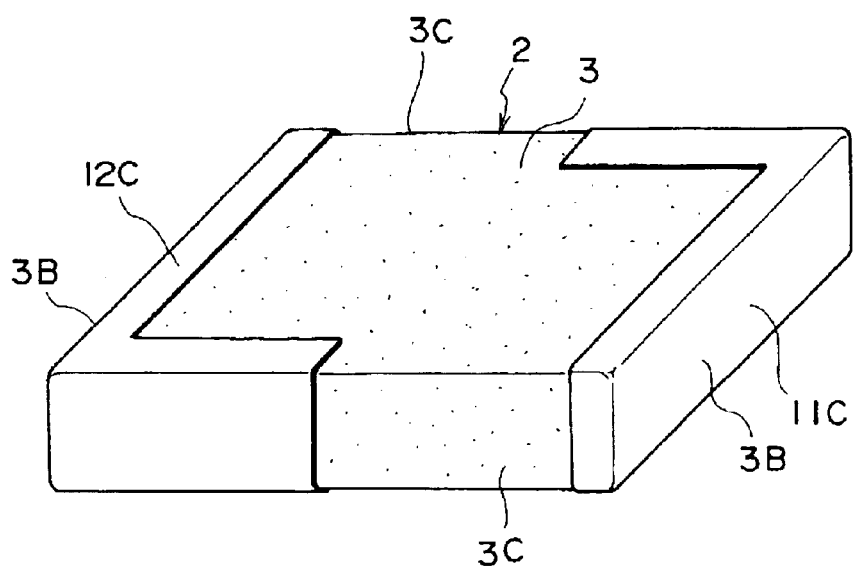
FIG. 8 is a perspective view illustrating the multilayer capacitor element that applies to the third embodiment of the present invention.

Next, an electronic component according to the third embodiment of the present invention is described based upon FIG. 7 and FIG. 8. It should be noted that the same reference numerals are applied to the same parts as described in the first embodiment, respectively, and duplicate descriptions will be omitted.

In this embodiment, as illustrated in FIG. 7, instead of forming two extended portions 4A and 4B in the internal conductors 4, a single extended portion 4C is formed continuously from the right side end portion to the back side end portion of each ceramic layer 3A. Accordingly, as illustrated in FIG. 8, a terminal electrode 11C is formed continuously across a plurality of or two side surfaces 3B and 3C of the dielectric element 3.

Furthermore, instead of forming two extended portions 5A and 5B in the internal conductors 5, a single extended portion 5C is formed continuously from the left side end portion to the front side end portion of each ceramic layer 3A. Accordingly, a terminal electrode 12C is formed continuously across a plurality of or two side surfaces 3B and 3C of the dielectric element 3.

As described above, operations where ESR is decreased while allowing for sufficient absorption of stress take effect in this embodiment as with the first embodiment. Moreover, since the terminal electrodes 11C and 12C are formed continuously across the two side surfaces 3B and 3C of the dielectric element 3, respectively, the number of terminal electrodes can be effectively reduced without reducing the area of connecting portions, whereby manufacturing costs of the compound ceramic capacitor 1 are lowered as a result.

It should be noted that at this time, length D1 of the extended portion 4C of the internal conductors 4 and length D2 of the extended portion 5C of the internal conductors 5 have at least ⅓ the length D shown in FIG. 7, which is the length of the side surfaces 3C of the dielectric element 3. According to this embodiment, effective utilization of the side surfaces 3C of the dielectric element 3 becomes possible, and the same operational effects as the first embodiment may be more reliably provided.

Figure 9:
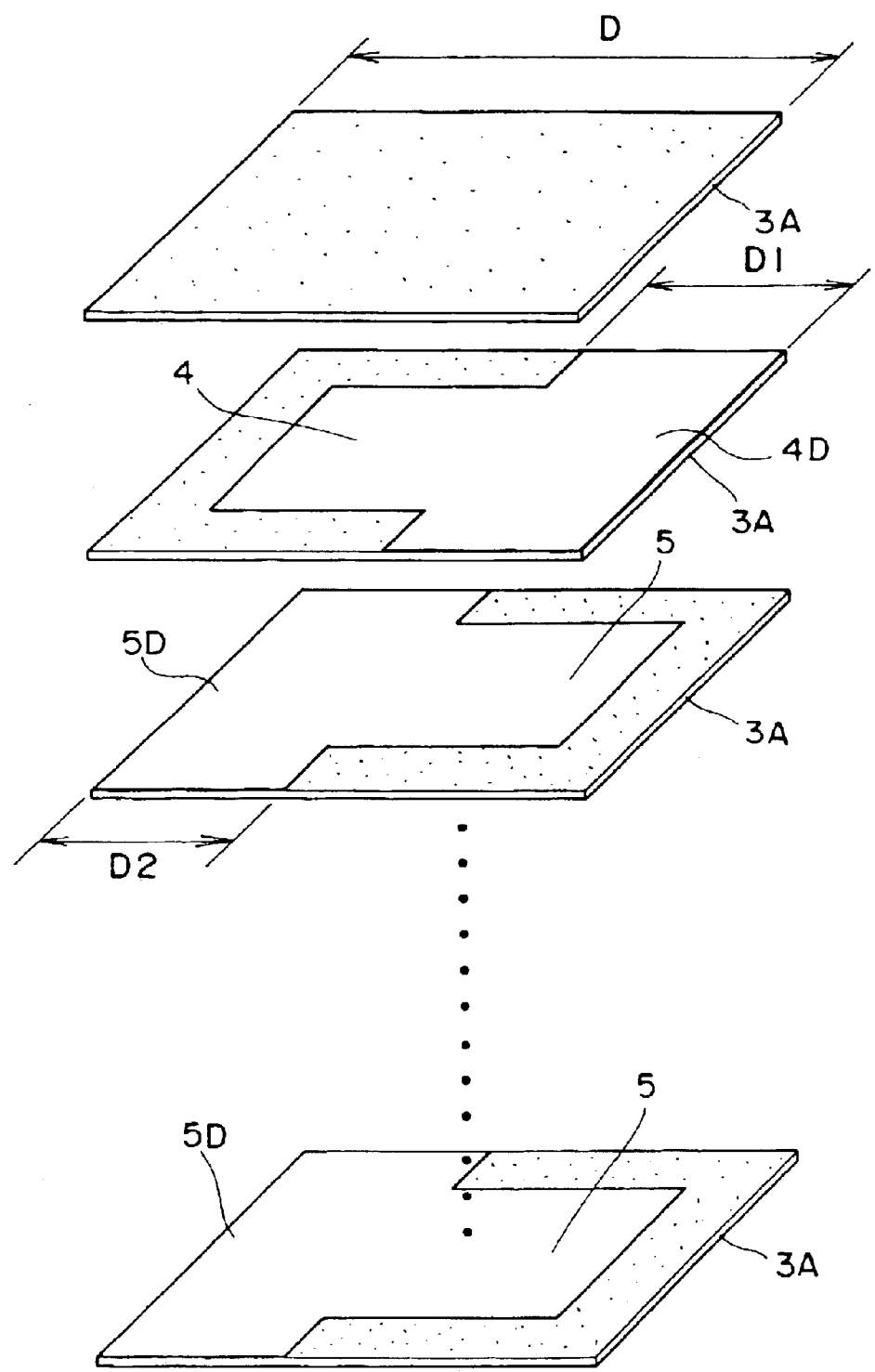
FIG. 9 is an exploded perspective view of a multilayer capacitor element that applies to a fourth embodiment of the present invention.
Figure 10:
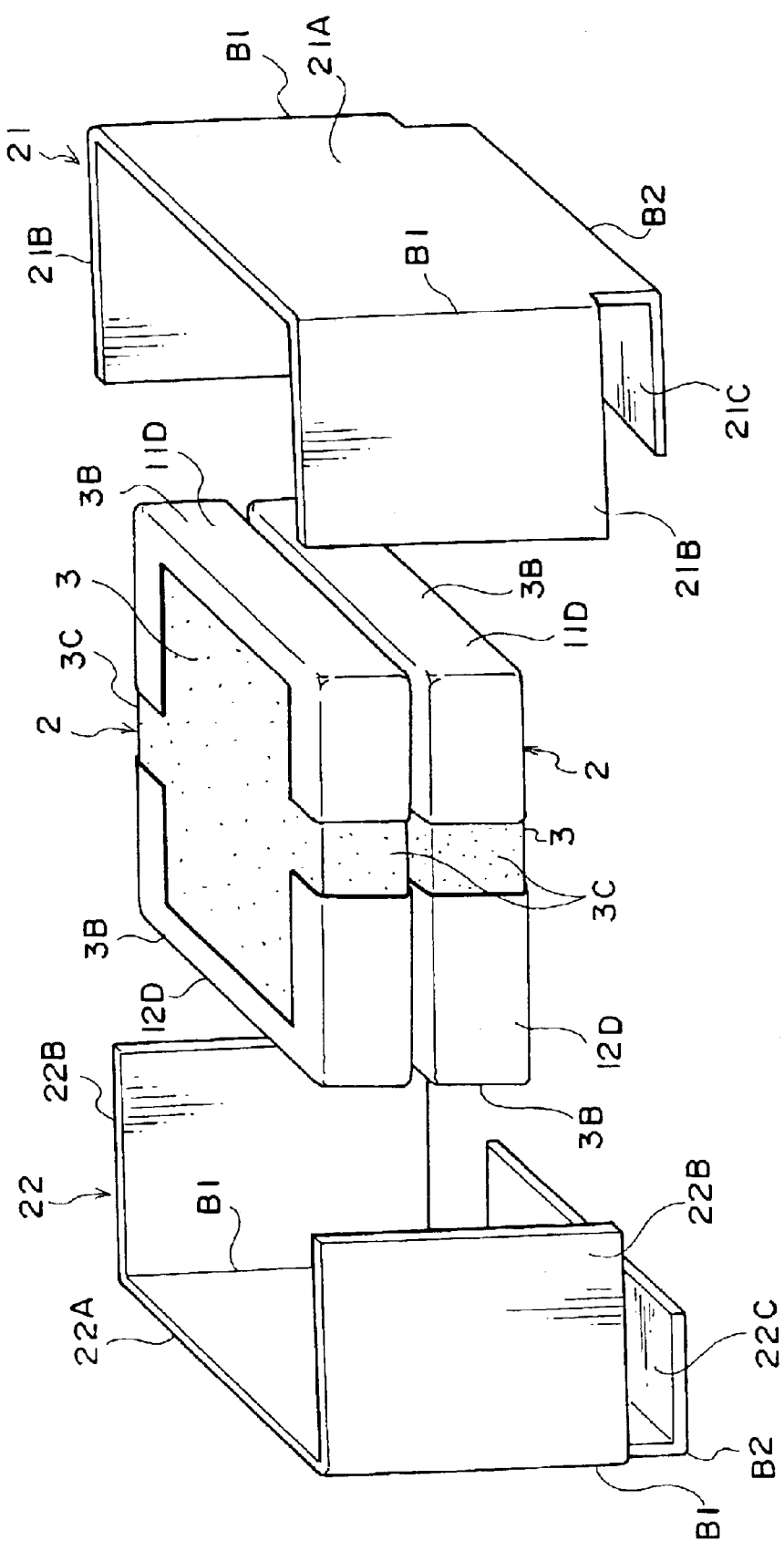
FIG. 10 is an exploded perspective view illustrating a compound ceramic capacitor according to the fourth embodiment of the present invention.

Next, an electronic component according to the fourth embodiment of the present invention is described based upon FIG. 9 and FIG. 10. It should be noted that the same reference numerals are applied to the same parts as described in the first embodiment, respectively, and duplicate descriptions will be omitted.

In this embodiment, as illustrated in FIG. 9, instead of forming two extended portions 4A and 4B in the internal conductors 4, a single extended portion 4D is formed continuously across from the back side end portion to the front side end portion that sandwich the right side end portion of each ceramic layer 3A. Accordingly, as illustrated in FIG. 10, each terminal electrode 11D is formed continuously across three corresponding side surfaces 3B and 3C of each dielectric element 3. It should be noted that the length D1 of the portions corresponding to the side surfaces 3C of this extended portion 4D also has at least ⅓ the length D of the side surfaces 3C as in the third embodiment.

Furthermore, instead of forming the two extended portions 5A and 5B in the internal conductors 5, a single extended portion 5D is formed continuously across from the front side end portion to the back side end portion that sandwich the left side end portion of each ceramic layer 3A. Accordingly, each terminal electrode 12D is formed continuously across three corresponding side surfaces 3B and 3C of each dielectric element 3. It should be noted that the length D2 of the portions corresponding to the side surfaces 3C of this extended portion 5D also has at least ⅓ the length D of the side surfaces 3C as in the third embodiment.

Accordingly, in this embodiment, the terminal electrodes 11D and terminal electrodes 12D are formed across the three corresponding side surfaces 3B and 3C of each dielectric element 3, respectively. Accordingly, the metallic terminal 21 is formed in a U-shaped structure having two inner connecting portions 21B, and the metallic terminal 22 is formed in a U-shaped structure having two inner connecting portions 22B.

Thus, operations where ESR is decreased while allowing for sufficient absorption of stress take effect in this embodiment as with the first embodiment. Moreover, since the terminal electrodes 11D and 12D are formed continuously across the plurality of or three side surfaces 3B and 3C of each dielectric element 3, respectively, the number of terminal electrodes can effectively be reduced without reducing the area of connecting portions, whereby manufacturing costs of the compound ceramic capacitor 1 are lowered as a result.

Figure 11:
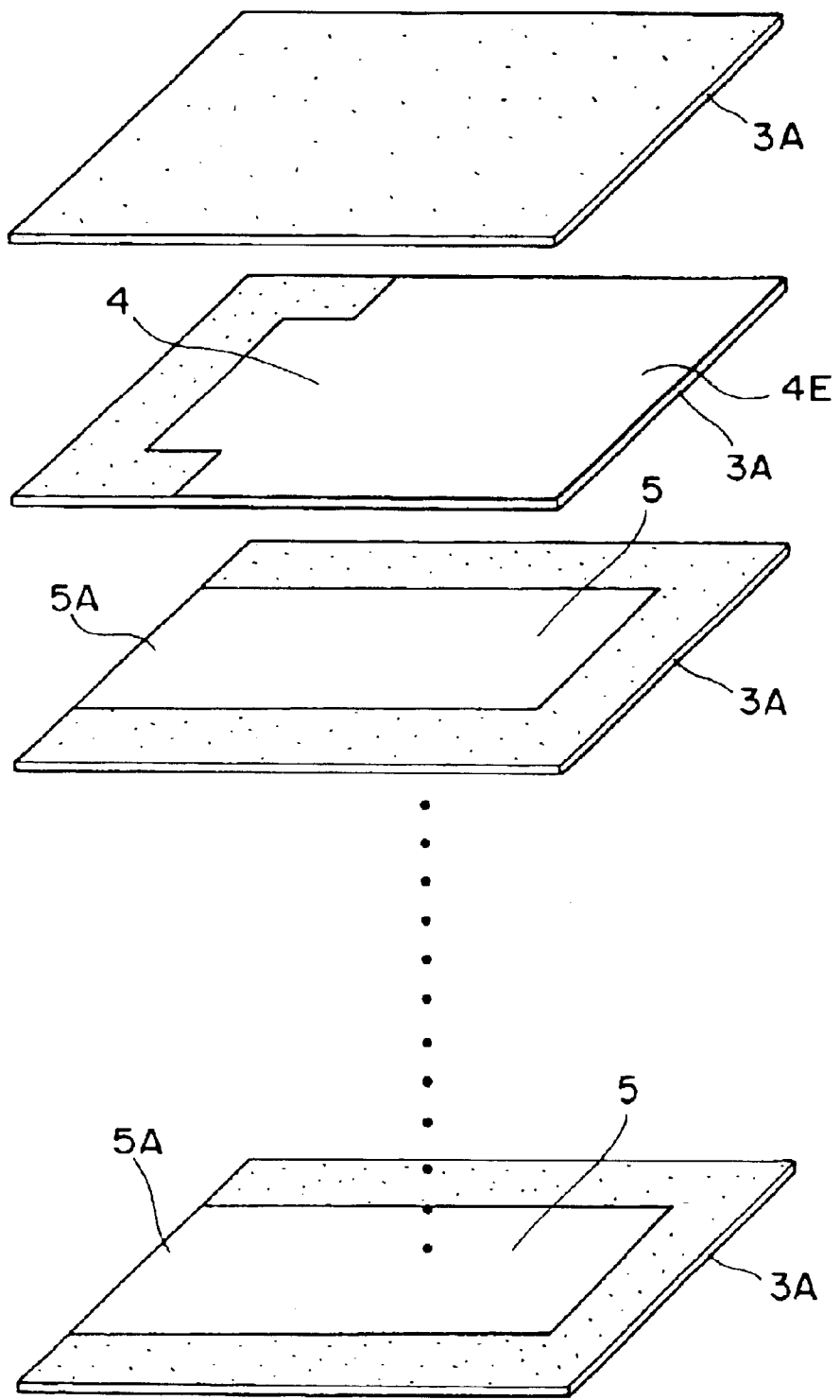
FIG. 11 is an exploded perspective view of a multilayer capacitor element that applies to a fifth embodiment of the present invention.
Figure 12:
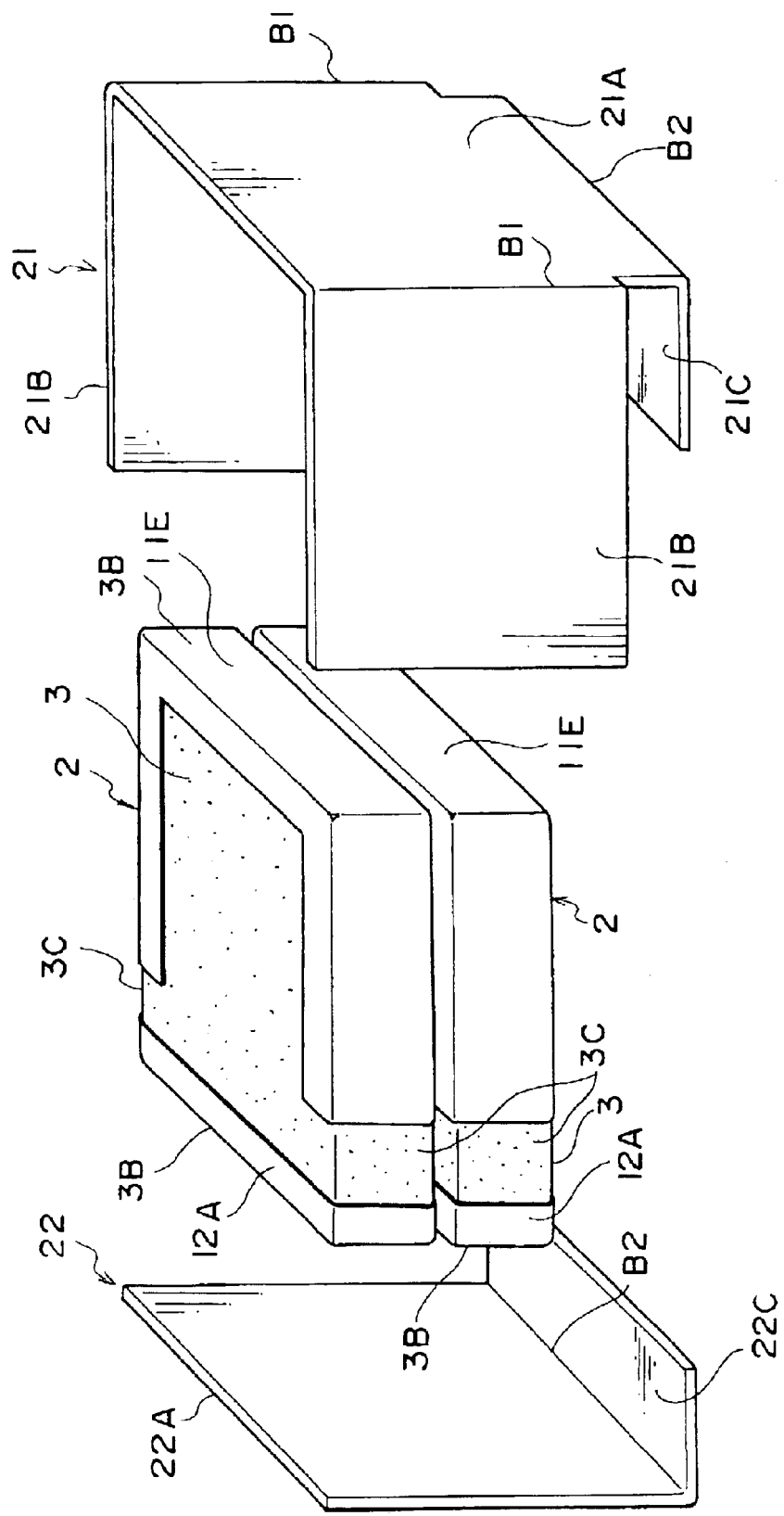
FIG. 12 is an exploded perspective view illustrating a compound ceramic capacitor according to the fifth embodiment of the present invention.

Next, an electronic component according to the fifth embodiment of the present invention is described based upon FIG. 11 and FIG. 12. It should be noted that the same reference numerals are applied to the same parts as described in the first embodiment, respectively, and duplicate descriptions will be omitted.

In this embodiment, as illustrated in FIG. 11, instead of forming the two extended portions 4A and 4B in the internal conductors 4, a single extended portion 4E is formed continuously across from the far side end portion to the front side end portion that sandwich the right side end portion of each ceramic layer 3A. Accordingly, as illustrated in FIG. 12, a terminal electrode 11E is formed continuously across a plurality of or three corresponding side surfaces 3B and 3C of each dielectric element 3. It should be noted that the portions corresponding to the side surfaces 3C of this extended portion 4E also have at least ⅓ the length of the side surfaces 3C as with the third embodiment.

Meanwhile, instead of forming the two extended portions 5A and 5B in the internal conductors 5, only a single extended portion 5A is formed at the left side end portion of each ceramic layer 3A. Accordingly, the same terminal electrode 12A as in the first embodiment is formed at one side surface 3B of each dielectric element 3.

Furthermore, in this embodiment, the terminal electrode 11E is formed continuously across the three sides surfaces 3B and 3C corresponding to each dielectric element 3, as well as the metallic terminal 21 is formed in a U-shaped structure having two inner connecting portions 21B.

Thus, operations where ESR is decreased take effect while allowing for sufficient absorption of stress in this embodiment as with the first embodiment. Moreover, since the terminal electrode 11E is formed continuously across the plurality of or three side surfaces 3B and 3C of each dielectric element 3, the number of terminal electrodes can effectively be reduced without reducing the area of connecting portions, whereby manufacturing costs of the compound ceramic capacitor 1 are lowered as a result.

At the same time, using an impedance analyzer, results of a test comparing the impedance and the like between the compound ceramic capacitor according to an embodiment and a capacitor of a conventional example are given below.

Figure 15:
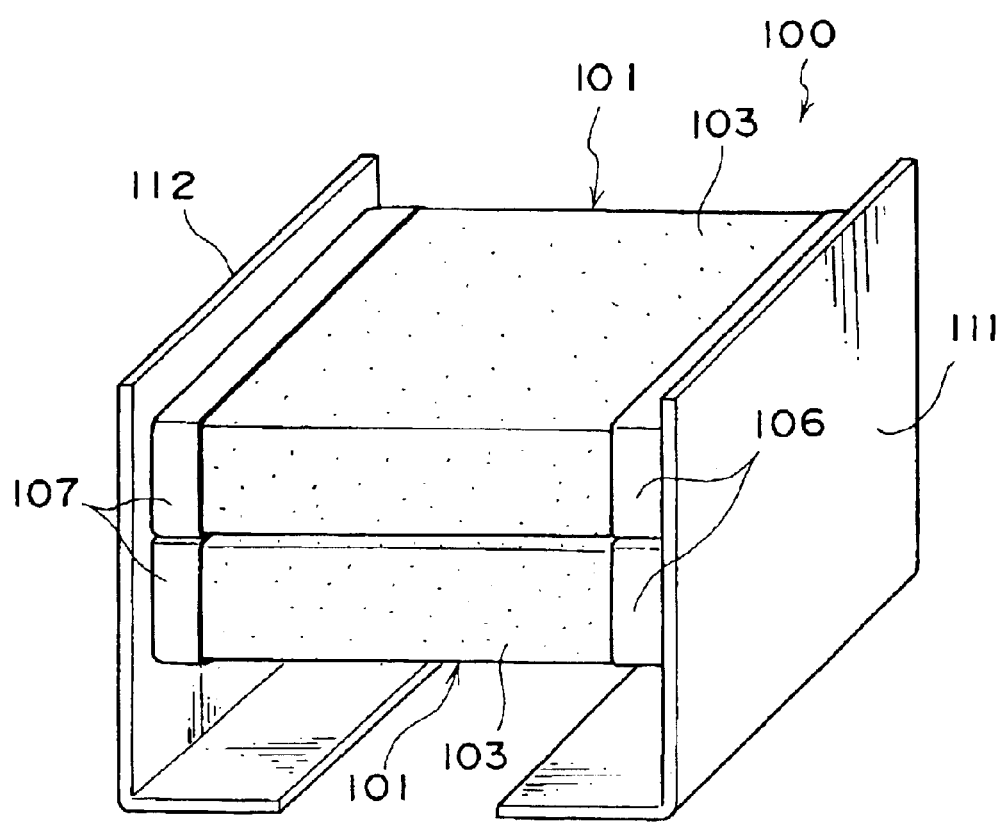
FIG. 15 is a perspective view illustrating the conventional compound ceramic capacitor.

It should be noted that a compound ceramic capacitor 100 that employs the conventionally structured metallic terminals illustrated in FIG. 15 is used as the capacitor of the conventional example to be compared here. By contrast, the capacitor of the first embodiment, for example, is used as the multilayer capacitor according to the embodiment. In other words, a compound ceramic capacitor with a two-layer structure having ceramic capacitors is used as a sample. However, these samples have the same number of layers, and the internal conductors and dielectric layers also have almost the same film thickness.

Figure 13:
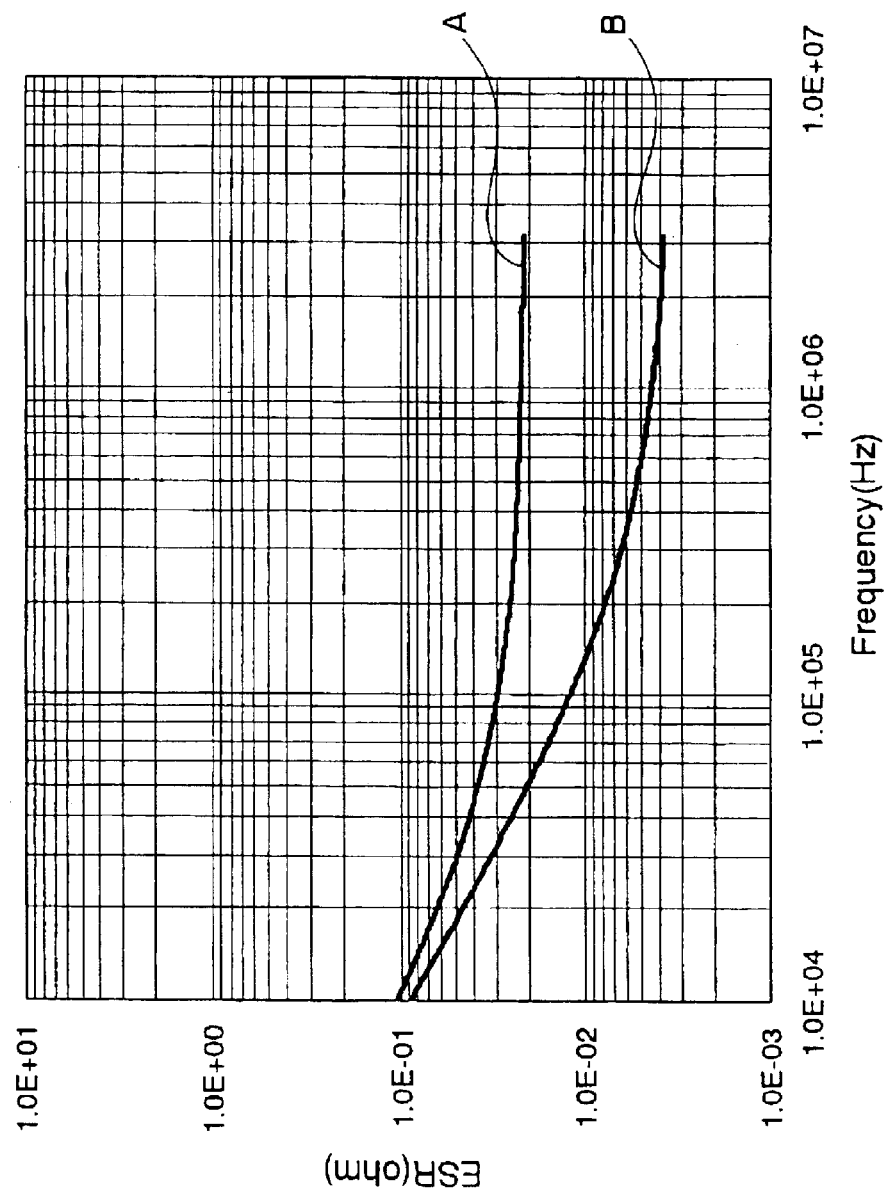
FIG. 13 is a diagram showing a graph, which compares ESR characteristics of a conventional example and an embodiment.
Figure 14:
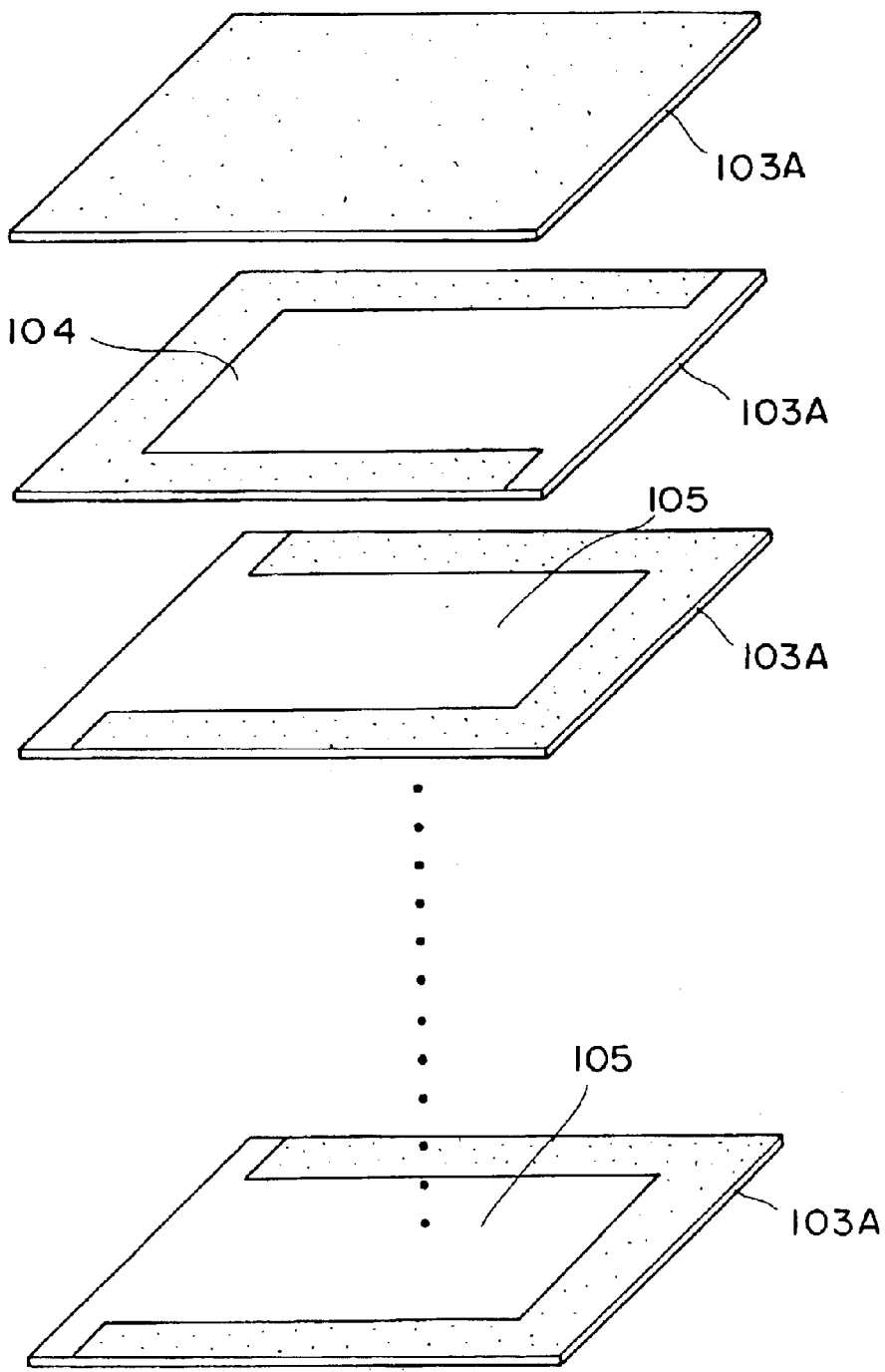
FIG. 14 is an exploded perspective view of a multilayer capacitor element that applies to a conventional compound ceramic capacitor.

As shown in FIG. 13 that presents measurement results, ESR for the characteristic curve B, which represents the characteristics for the compound ceramic capacitor 1 according to the embodiment, is always low in relation to ESR for the characteristic curve A, which represents the characteristics of the conventional example compound ceramic capacitor 100, and the higher the frequency, the greater the difference in ESR tends to become can especially be understood.

Specifically, the equivalent series resistance value of the conventional example compound ceramic capacitor 100 at a frequency of 500 KHz is 23.0 mΩ, and contrastingly, the equivalent series resistance value of the compound ceramic capacitor 1 according to an embodiment is 23.0 mΩ. In other words, it is verified that ESR of the compound ceramic capacitor 1 according to the embodiment is evidently reduced in comparison to ESR of the conventional example compound ceramic capacitor 100.

It should be noted that as a result of measuring electrostatic capacity at a frequency of 1 KHz, the electrostatic capacity value of the conventional example compound ceramic capacitor 100 is 1.95 $\mu$F, and contrastingly, the electrostatic capacity value of the compound ceramic capacitor 1 according to the embodiment is 2.03 $\mu$F. Furthermore, each of the multilayer capacitor elements used in the test has an electrostatic capacity value of 1.0 $\mu$F, and is one where measurement L in FIG. 5 is 5.7 mm, and measurement W is 5.0 mm.

Moreover, in result of measuring temperature rise due to self-heating when applying ripple currents, the temperature rise due to self-heating in the conventional example compound ceramic capacitor 100 is 57° C., and contrastingly, the temperature rise due to self-heating in the compound ceramic capacitor 1 according to the embodiment is 11° C. Here, conditions for the ripple current are the sine wave at the frequency 500 KHz, and a current value of 2A rms.

On one hand, the metallic terminals of the above embodiment is considered to be made of material of relatively low electrical resistance as well as having excellent spring characteristics. The board material phosphor bronze is a representative example. Furthermore, board thickness is not to be limited, however, it is typically considered to be approximately 0.1 mm.

Moreover, the folding angle at the folding lines B1 and B2 is considered to be nearly 90°, however it may also be an angle other than 90°. However, it may also be a form without a distinct angle such as an arc shape at the folding lines B1 and B2.

On the other hand, in the above embodiment, the structure is one where two of the multilayer capacitor elements are respectively sandwiched, however it may also be a structure where one or three or more multilayer capacitor elements are sandwiched. Furthermore, the number of internal conductors of the multilayer capacitor elements is not limited to the number of compound ceramic capacitors 1 according to the above embodiment, whereby there may even be a greater number of them; furthermore, the order of layering the internal conductors may also be arbitrarily changed.

According to the present invention, it is possible to provide electronic components with reducible ESR while sufficiently allowing for absorption of stress.

What is claimed is:

1. An electronic component, comprising:
a dielectric element formed by layering dielectric layers;
two types of internal conductors, which are respectively arranged within the dielectric element while separated from each other by the dielectric layers, and have a plurality of extended portions, respectively, that are extended toward a plurality of side surfaces of the dielectric element, respectively;
two types of terminal electrodes, which are arranged at a plurality of side surfaces of the dielectric element, respectively; one of the two types of terminal electrodes connected to a plurality of extended portions of one of the two types of internal conductors, and the other of the two types of terminal electrodes connected to the remaining plurality of extended portions; and
a pair of metallic terminals, which are respectively formed by metallic material, each of the metallic terminals having a plurality of connecting surfaces; the plurality of connecting surfaces of one of the metallic terminals connected to one of the two types of terminal electrodes arranged within the same dielectric element; and the plurality of connecting surfaces of the other of the metallic terminals connected to the remaining terminal electrodes.

2. The electronic component, according to claim 1, wherein each metallic terminal has a plurality of connecting surfaces, which are provided by folding a board material.

3. The electronic component, according to claim 1, wherein one end portion of each metallic terminal is a connecting side that is connected to the terminal electrodes, as well as the other end is an outer connecting portion configured to allow connection with the outside.

4. The electronic component, according to claim 3, wherein a plurality of outer connecting portions are formed upon each metallic terminal.

5. An electronic component, comprising:

a dielectric element formed by layering dielectric layers;

two types of internal conductors, which are respectively arranged within the dielectric element while separated from each other by the dielectric layers, and which have a single extended portion that is extended in a form continuing across a plurality of side surfaces of the dielectric element, respectively;

two types of terminal electrodes, each of which is arranged in a form continuing across a plurality of side surfaces of the dielectric element; one of the two types of terminal electrodes connected to an extended portion of one of the two types of internal conductors, and the other of the two types of terminal electrodes connected to the remaining extended portion; and a pair of metallic terminals, which are respectively formed by metallic material, each of the metallic terminals having a plurality of connecting surfaces; the plurality of connecting surfaces of one of the metallic terminals connected to one of the two types of terminal electrodes arranged within the same dielectric element, and the plurality of connecting surfaces of the other of the metallic terminals connected to the remaining terminal electrode.

6. The electronic component, according to claim 5, wherein the extended portion is formed having a length of at least ⅓ the length of the side surface of the dielectric element whereto the extended portion of each internal conductor is extended.

7. The electronic component, according to claim 5, wherein each metallic terminal has a plurality of connecting surfaces, which is obtained by folding a board material.

8. The electronic component, according to claim 5, wherein one end portion of each metallic terminal is a connecting side that is connected to a terminal electrode, as well as the other end is an outer connecting portion configured to allow connection with the outside.

9. An electronic component, comprising:

a dielectric element formed by layering dielectric layers;

two types of internal conductors, which are respectively arranged within the dielectric element while separated from each other by the dielectric layers, and which have a single extended portion, respectively, which is extended in a form continuing across three side surfaces of the dielectric element;

two types of terminal electrodes, each of which is arranged in a form continuing across three side surfaces of the dielectric element; one of the two types of terminal electrodes connected to the extended portion of one of the two types of internal conductors, and the other of the two types of terminal electrodes connected to the remaining extended portion; and a pair of metallic terminals, which are respectively formed by metallic materials, each of the metallic terminals having three connecting surfaces; the three connecting surfaces of one of the metallic terminals connected to one of the two types of terminal electrodes arranged in the same dielectric element, and the three connecting surfaces of the other of the metallic terminals connected to the remaining terminal electrode.

10. The electronic component, according to claim 9, wherein the extended portion is formed having a length of at least ⅓ the length of the side surface of the dielectric element whereto the extended portion of each internal conductor is extended.

11. The electronic component, according to claim 9, wherein each metallic terminal has a plurality of connecting surfaces, which is obtained by folding a board material.

12. The electronic component, according to claim 9, wherein one end portion of each metallic terminal is a connecting side that is connected to a terminal electrode, as well as the other end is an outer connecting portion configured to allow connection with the outside.

13. An electronic component, comprising:

a dielectric element formed by layering dielectric layers;

two types of internal conductors, which are respectively arranged within the dielectric element while separated from each other by the dielectric layers; one of the two types of internal conductors having a single extended portion that is extended in a form continuing across a plurality of side surfaces of the dielectric element, and the other of the two types of internal conductors having a single extended portion that is extended toward one side surface of the dielectric element;

two types of terminal electrodes, at least one of the two types of terminal electrodes arranged in a form continuing across a plurality of side surfaces of the dielectric element; one of the two types of terminal electrodes connected to the extended portion of one of the two types of internal conductors, and the other of the two types of terminal electrodes connected to the remaining extended portion; and a pair of metallic terminals, which are respectively formed by metallic materials, at least one of the metallic terminals having a plurality of connecting surfaces; the plurality of connecting surfaces, which are provided in at least one of the metallic terminals connected to the terminal electrode which is arranged in a form continuing across the plurality of side surfaces, out of the two types of terminal electrodes arranged in the same dielectric element, and the other of the metallic terminals connected to the remaining terminal electrode.

14. The electronic component, according to claim 13, wherein the extended portion is formed having a length of at least ⅓ the length of the side surfaces of the dielectric element whereto the extended portion of each internal conductor is extended.

15. The electronic component, according to claim 13, wherein the terminal electrodes, which are formed continuously across a plurality of side surfaces of the dielectric element, are connected to a single extended portion that is extended in a form continuing across a plurality of side surfaces of the dielectric element.

16. The electronic component, according to claim 13, wherein each metallic terminal has a plurality of connecting surfaces, which is obtained by folding a board material.

17. The electronic component, according to claim 13, wherein one end portion of each metallic terminal is a connecting side that is connected to a terminal electrode, as well as the other end is an outer connecting portion configured to allow connection with the outside.

* * * * *